(12) United States Patent
Chang et al.

(10) Patent No.: US 7,940,143 B2
(45) Date of Patent: May 10, 2011

(54) VERTICAL TRANSMISSION LINE STRUCTURE THAT INCLUDES BUMP ELEMENTS FOR FLIP-CHIP MOUNTING

(75) Inventors: Edward Yi Chang, Hsinchu (TW); Wei-Cheng Wu, Hsinchu (TW); Ruey-Bing Hwang, Hsinchu (TW); Li-Han Hsu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 222 days.

(21) Appl. No.: 12/196,529

(22) Filed: Aug. 22, 2008

(65) Prior Publication Data
US 2009/0267201 A1    Oct. 29, 2009

(30) Foreign Application Priority Data

Apr. 25, 2008 (TW) ................................ 97115188 A

(51) Int. Cl.
*H01P 5/02* (2006.01)

(52) U.S. Cl. ............ 333/33; 333/260; 257/664; 257/728
(58) Field of Classification Search .................. 333/248, 333/260, 246, 33; 257/664, 778
See application file for complete search history.

(56) References Cited

U.S. PATENT DOCUMENTS

| | | | |
|---|---|---|---|
| 6,172,497 B1 * | 1/2001 | Okumichi ................. | 324/158.1 |
| 6,400,241 B1 * | 6/2002 | Ulian et al. ................. | 333/246 |
| 6,417,747 B1 * | 7/2002 | Dearden et al. ............. | 333/247 |
| 2008/0246562 A1 * | 10/2008 | Sherrer et al. ............... | 333/260 |

* cited by examiner

*Primary Examiner* — Benny Lee
(74) *Attorney, Agent, or Firm* — Muncy, Geissler, Olds & Lowe, PLLC

(57) ABSTRACT

A vertical transmission structure for high frequency transmission lines includes a conductive axial core and a conductive structure surrounding the conductive axial core. The vertical transmission structure is applied to a high-frequency flip chip package for reducing the possibility of underfill from coming in contact with the conductive axial core.

18 Claims, 9 Drawing Sheets

VERTICAL TRANSMISSION LINE STRUCTURE THAT INCLUDES BUMP ELEMENTS FOR FLIP-CHIP MOUNTING

BACKGROUND OF THE INVENTION

1. Field of the Invention

The present invention relates to vertical transmission structures, and vertical transmission structures for high-frequency transmission lines.

2. Background of the Related Art

Along with the rapid advances in wireless communication products development in recent years, a planar PCB architecture can not satisfy the demand of low cost, high density and compact products. Thus, the vertical interconnection of low temperature co-fired ceramics (LTCC) package or multi-layer PCB have gradually replaced the design of the planar PCB. However, the via design for the multi-layer PCB or LTTC may cause parasitic impedances or inductances.

There have been various types for vertical transmission, such as transmission between microstrip line and strip line, microstrips, coplanar waveguides, or coplanar waveguide and strip line. Taking the first type as an example, the vertical transmission interconnects between the coplanar waveguides do not cause large return loss in low frequencies, however, the parasitic effects from the vertical transmission interconnects can degrade the characteristics of return parameters with increase in the operating frequencies. Generally, the compensation of local matching may reduce the parasitic effects and further convert them to an inductance effect to achieve both the impedance match and prevent the parasitic effects. In the second type, the microstrip line transmission with slots or cavities does not adopt a via architecture to prevent the parasitic effects. The slot configuration may generate inductance effects to achieve impedance match. The improved cavity configuration includes both a dielectric layer between two ground layers made of same metallic material and a slot to perform coupling by waveguides. In the third type, the transmission between microstrip line and strip line improves frequency band characteristics by high impedance compensation that utilizes a high-impedance line with additional inductance to compensate the capacitance of transmission lines. It may be due to different impedances generated by the lines with various widths. The impedances may be raised by decreasing the widths and converted into inductances.

FIG. 1 is a top-view perspective diagram illustrating a conventional three ground bump configuration of a high-frequency flip chip package. A substrate 10 has a coplanar waveguide 12. The circuit layer 16 of a microwave chip package 18 is coupled to the coplanar waveguide 12 via three bumps 14. There are various transmission structures applied to various packages. Basically, the parasitic effects from various wiring configurations of the packages are raised with increase of operating frequencies. Thus, flip chip package has been gradually applied to high-frequency products. However, when the underfill comes in contact with the transmission structures of the flip chip package, significant waveband frequency loss of transmission lines occurs. Attempts are still being made to improve the transmission architecture of transmission lines to achieve reduction in the loss of waveband frequency.

SUMMARY OF THE INVENTION

The present invention is directed to a transmission structure, which may be suitable for reducing the possibility of the underfill from coming in contact with the vertical transmission structure between connected lines to increase the performance of the transmission lines.

The present invention is also directed to a transmission structure which may be suitable for improving the transmission efficiency between a microwave chip and a package substrate and reduce crosstalk, insertion loss and return loss of the signal lines.

The present invention is also directed to a transmission structure having a coaxial configuration suitable to provide more return current paths.

Accordingly, one embodiment of the transmission structure of chip includes a chip having an insulating surface; a signal line disposed over the insulating surface, wherein the signal line includes a bar bump and two terminals; a ground bump separately disposed over the insulating surface, set coplanarly with and electrically isolated from the signal line, and an expansion bump formed around each terminal; a dielectric layer disposed over the signal line and the ground bump, wherein the dielectric layer exposes the two terminals and a portion of each expansion bump; two first conductive connectors disposed over the dielectric layer, wherein the two first conductive connectors respectively correspond and in contact with the two exposed expansion bumps; and two second conductive connectors disposed over the dielectric layer and respectively in contact with the two exposed terminals, wherein each of the second conductive connectors respectively serves as a center of axis of the first conductive connectors.

Another embodiment of the transmission structure of high-frequency transmission line includes a substrate having an insulating surface formed thereon; a pattern of high-frequency transmission structures disposed over the insulating surface, wherein the pattern of high-frequency transmission structures includes a signal line having a bar bump and a terminal; and a ground bump separately set over the substrate, set coplanarly with and electrically isolated from the signal line, wherein the ground bump surrounds the bar bump and includes an expansion bump surrounding the terminal; a dielectric layer disposed over the pattern of high-frequency transmission structures, wherein the dielectric layer exposes the terminal and the expansion bump of the ground bump; a first conductive connector disposed over the dielectric layer and in contact with the exposed expansion bump; and a second conductive connector disposed over the dielectric layer and in contact with the exposed terminal, wherein the second conductive connector serves as a center of axis of the first conductive connector.

DETAILED DESCRIPTION OF THE INVENTION

Figure 1:
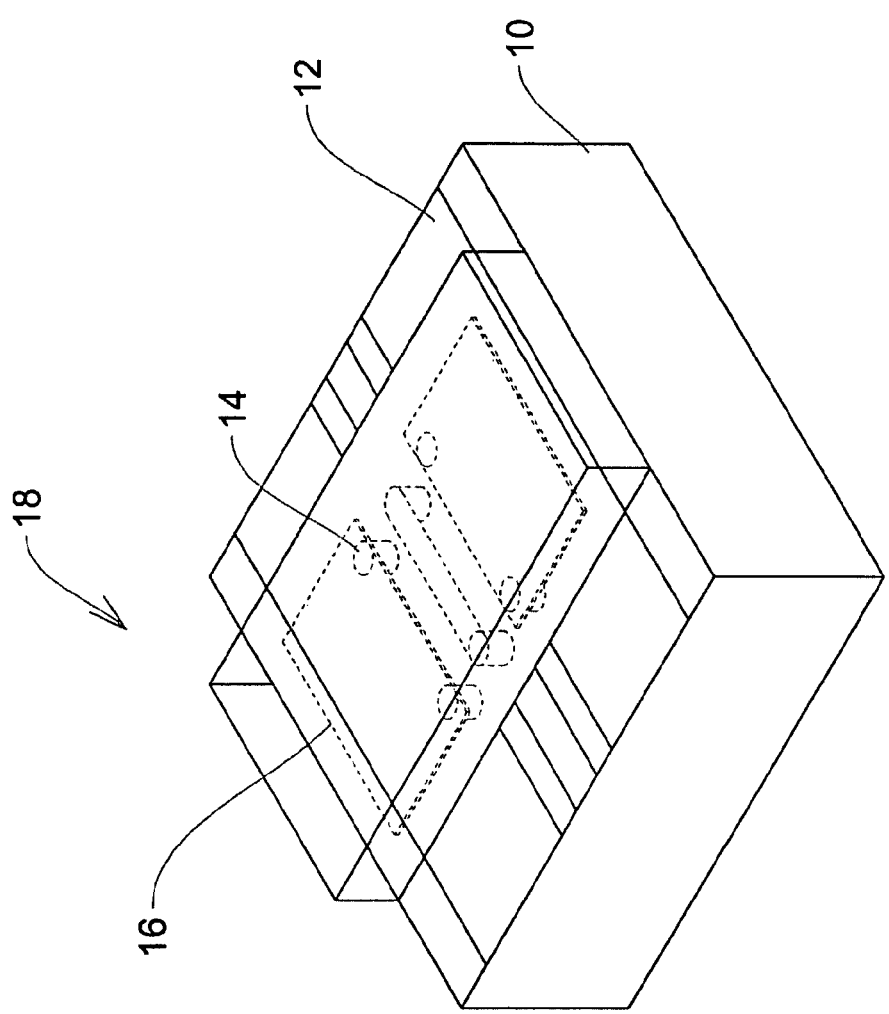
FIG. 1 is a top-view perspective diagram illustrating a conventional three-grounding bump of a high-frequency flip chip package.
Figure 2A:
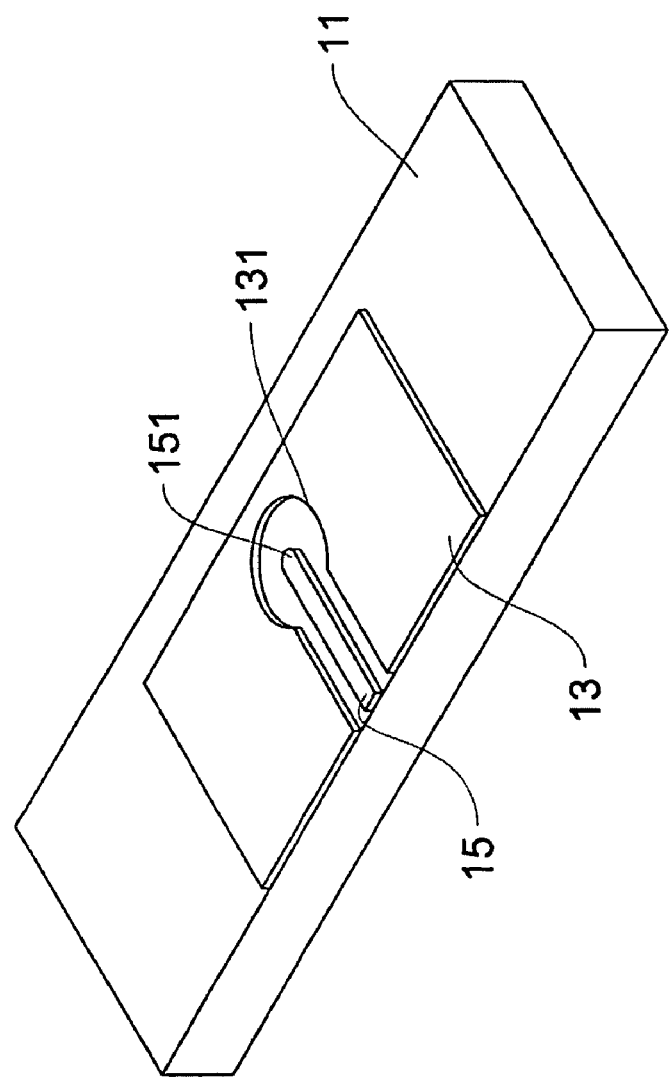
FIGS. 2A to 2E are cross-sectional perspective diagrams illustrating a process of fabricating substrates of high-frequency flip chip package according to one embodiment of the present invention.

FIGS. 2A to 2E are cross-sectional perspective diagrams illustrating a process of fabricating substrates of high-frequency flip chip package according to one embodiment of the present invention. As shown in FIG. 2A, a conductive layer is formed over a substrate 11 having an insulating surface. A pattern of high-frequency transmission structures is transferred onto the conductive layer. The pattern of high-frequency transmission structures includes a signal line 15 and a ground bump 13 set coplanarly with and electrically isolated from the signal line 15. In one embodiment, the substrate 11 may be comprised of a single or multiple layers made of glass, silicon, ceramic or polymer material. The conductive layer may include a copper foil laminated with the substrate 11, a copper foil with electroplated copper, or a substrate electroplated with an electroplated copper. Alternatively, the conductive layer may include, for example but not limited to, a gold layer, and may be formed over the substrate 11 by lithography and electroplating process.

Next, the signal line 15 extends from one side of the substrate 11 to the center thereof, and comprises a bar bump and a terminal 151. The ground bump 13 extends from the side of the substrate 11, and includes a key hole shaped opening including an expansion bump 131 surrounding the bar bump of the signal line 15 such that the space between the ground bump 13 and the bar bump of the signal line 15 is smaller than that between the expansion bump 131 of the ground bump 13 and the terminal 151 of the signal line 15. In the present embodiment, the expansion bump 131 has an arc shape. Alternatively, the expansion bump 131 may also have other geometric shapes, such as but not limited to a square or a diamond shape.

Figure 2B:
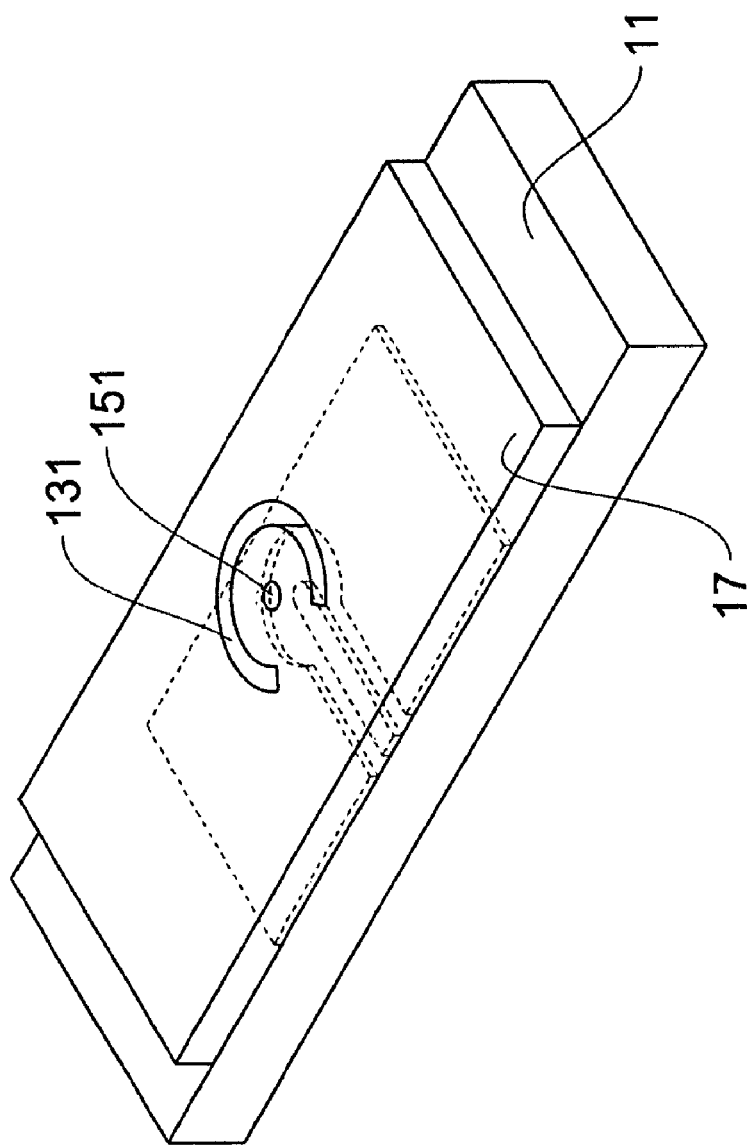

Referring to FIG. 2B, a dielectric layer 17 is formed over the pattern of high-frequency transmission structures and a portion of the substrate 11. Next, a portion of the dielectric layer 17 is removed by using any well known process, such as etching, to expose the terminal 151 and the expansion bump 131. In one embodiment, the dielectric layer 17 may be made of benzocyclobutene, photo-benzocyclobutene, polyimide, nitride, oxide or ceramic material.

Figure 2C:
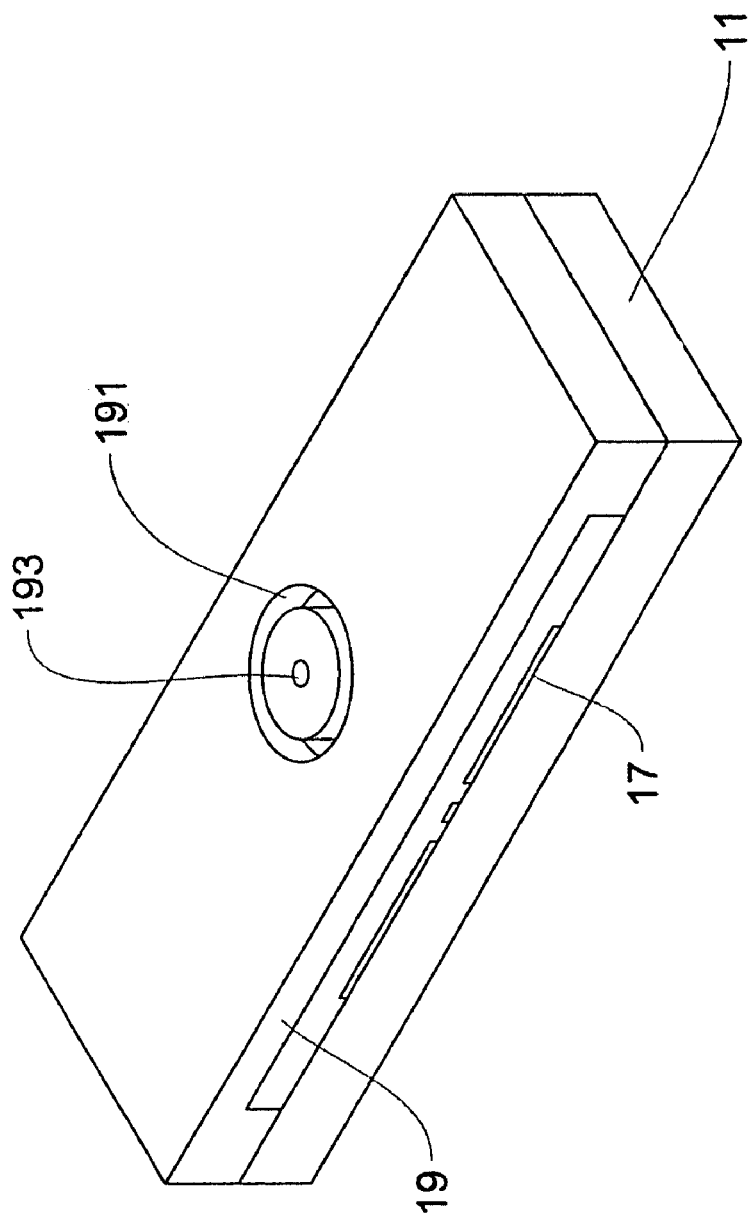

As shown in FIG. 2C, a photoresist layer 19 is formed over the dielectric layer 17 and the substrate 11 by using any well known process, such as spin coating or dry film covering process. The photoresist layer 19 is subjected to photolithography and etching process to form a first pattern 191 and a second pattern 193. The terminal 151 is exposed by the first pattern 191. The expansion bump 131 and the portion of the dielectric layer 17 are exposed by the second pattern 193. The exposed portion of the expansion bump 131 and the exposed portion of the dielectric layer 17 constitute a coaxial circular pattern with the terminal 151. It is understood that the shape of the expansion bump 131 and the terminal 151 is not limited to be a circular pattern, the expansion bump 131 may also have other coaxial geometric shapes.

Figure 2D:
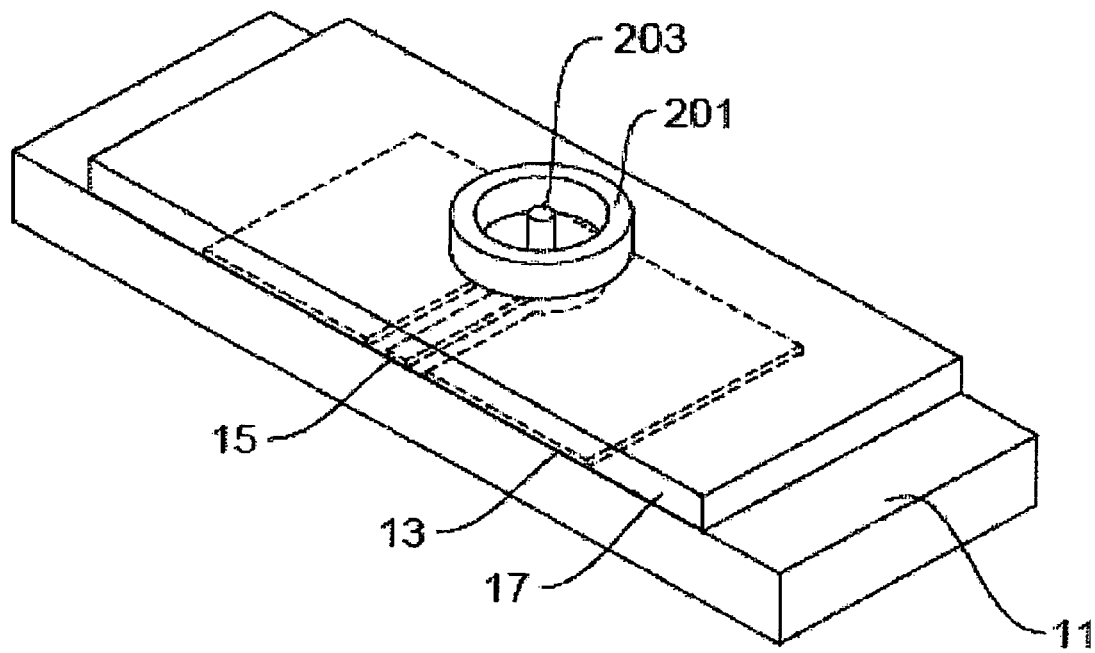
Figure 2E:
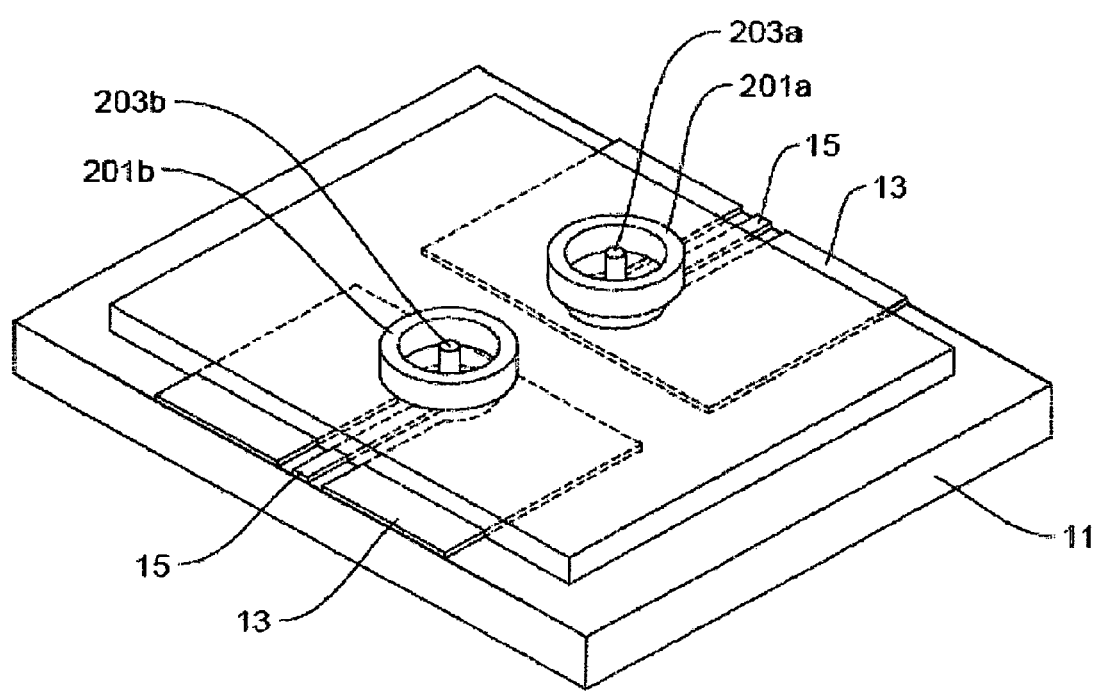

Next, an electroplating or an evaporation process is carried out to form a conductive layer over the first pattern 191 and the second pattern 193, such as either a titanium layer or a gold layer thereon. The whole structure is first subjected to a curing process and then the photoresist layer 19 (shown in FIG. 2C) is removed to form a first conductive connector 201 and a second conductive connector 203 protruding out from the dielectric layer 17 over the substrate 11, as shown in FIG. 2D. The first conductive connector 201 is electrically connected to the ground bump 13 and electrically isolated from the signal line 15. The second conductive connector 203 is electrically connected to the terminal of the signal line 15 and electrically isolated from the ground bump 13. The first conductive connector 201 has a fully enclosed shape, such as but not limited to a fully enclosed ring shape. The second conductive connector 203 has a rod shape and serves as a center of axis of the first conductive connector 201. Shown in FIG. 2E is a substrate structure for high-frequency flip chip package formed with two of the structures shown in FIG. 2D disposed back-to-back. The substrate structure for high-frequency flip chip package includes a signal line 15 divided into two parts, a ground bump 13 divided in to two parts, two first conductive connectors 201a and 201b respectively connecting with one part of the ground bump 15 and two second conductive connectors 203a and 203b respectively connecting with one part of the signal line 15. The first and second conductive connectors 201a, 201b and 203a, 203b may be located over a central area of the substrate 11. Moreover, the signal line 15 of ground bump 13 located over the edge of the substrate 11 is exposed for use for connection.

Figure 3:
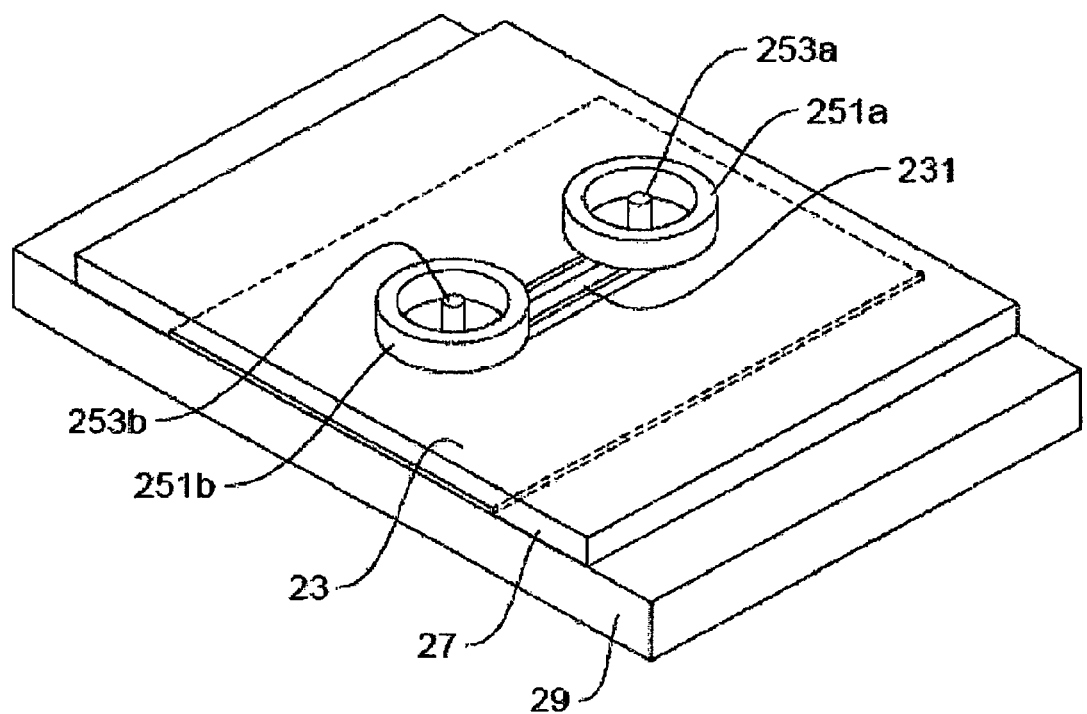
FIG. 3 is a top-view perspective diagram illustrating a high-frequency flip chip package according to one embodiment of the present invention.

FIG. 3 is a top-view perspective diagram illustrating a high-frequency flip chip package according to one embodiment of the present invention. As shown in FIG. 3, the active surface (not shown in this figure) of a chip 29 is faced down. A dielectric layer 27 is disposed on the circuit side of the chip 29. The circuit side has two of the patterns of high-frequency transmission structures similar to one shown in FIG. 2A disposed face-to-face, which includes a signal line 231 and a ground bump 23 around the signal line 231. First conductive connectors 251a and 251b and second conductive connectors 253a and 253b are formed by using the same process steps illustrated with reference to FIG. 2B to FIG. 2E. The first conductive connectors 251a and 251b respectively correspond to and disposed around the second conductive connectors 253a and 253b. The first conductive connectors 251a and 251b are electrically connected to the ground bump 23. One end of the second conductive connectors 253a and 253b respectively is electrically connected to the signal line 231.

Figure 4A:
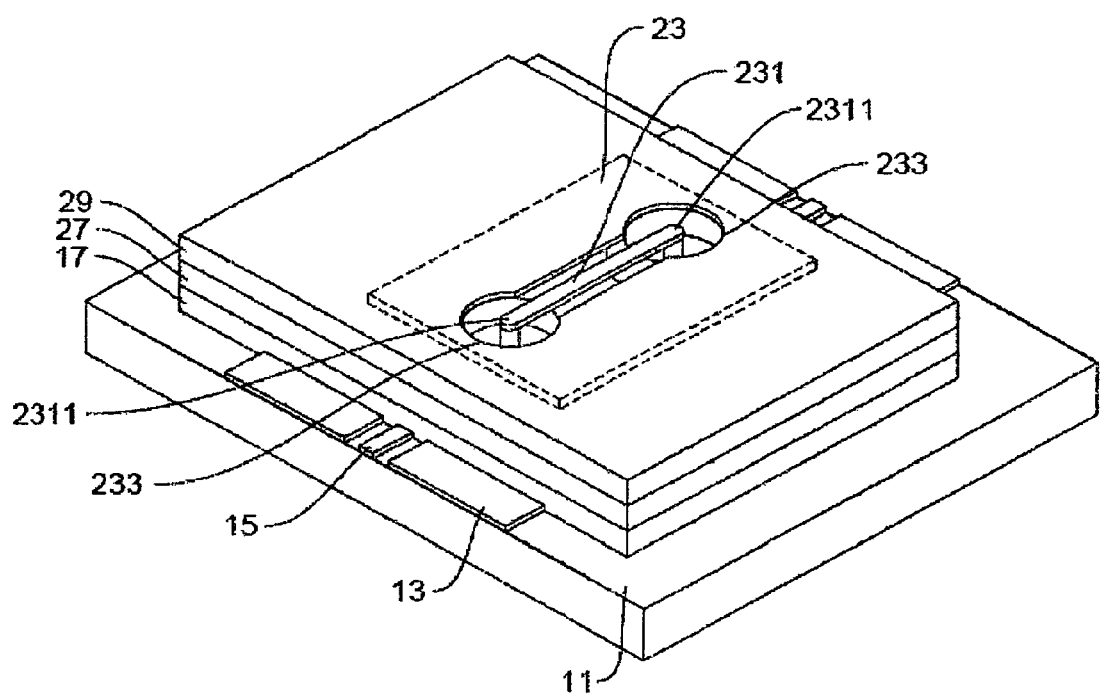
FIG. 4A is a schematic diagram illustrating the combination of a substrate and package according to one embodiment of the present invention.

FIG. 4A is a schematic diagram illustrating the combination of a substrate and a flip chip package according one embodiment of the present invention. Referring to FIG. 4A, FIG. 2A and FIG. 2E, the substrate 11 includes a first signal line 15 and a first ground bump 13 coplanarly and separately located and electrically isolated from each other, wherein the first signal line 15 includes two first bar bumps and two first terminals 151 (one shown in FIG. 2A), and the first ground bump 13 includes two first expansion bumps 131 each surrounding one of the first terminals 151 (one shown in FIG. 2A). Referring to FIG. 4A, the dielectric layer 17 covers a portion of the first ground bump 13 and a portion of the first signal line 15. The flip chip 29 includes a second signal line 231 and a second ground bump 23 that are coplanarly and separately located and electrically isolated from each other, wherein the second signal line 231 includes a second bar bump and two second terminals 2311, and the second ground bump 23 includes two second expansion bumps 233 each surrounding one of the second terminals 2311.

Figure 4B:
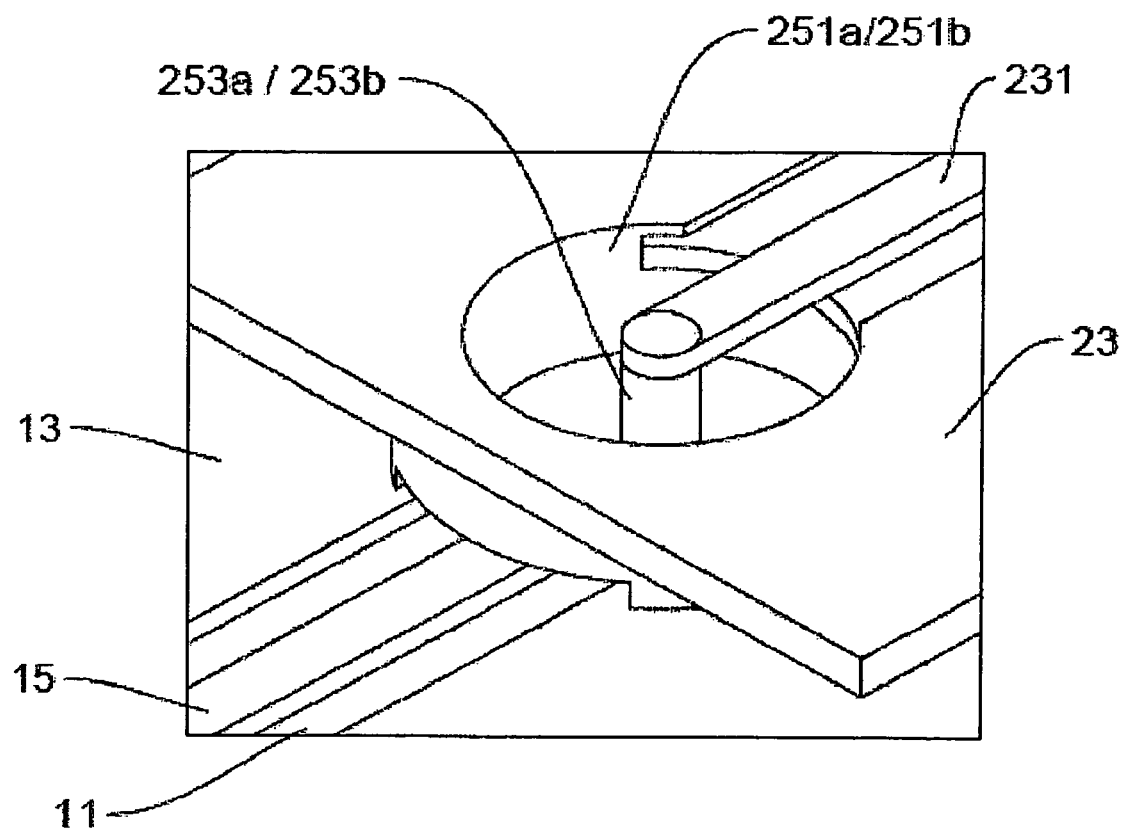
FIG. 4B is a scaled-up schematic diagram illustrating a transmission structure according to one embodiment of the present invention.

FIG. 4B is a scaled-up schematic diagram illustrating a transmission structure according to one embodiment of the present invention. The dielectric layers 17, 27 (See FIG. 4A) are omitted from the drawing for the convenience of illustration. As shown in FIG. 4B, for forming the transmission structure, the first signal line 15 over the substrate 11 is connected to the second signal line 231 of the flip chip via the structural connection of the second conductive connector 203a/203b shown in FIG. 2D and the second conductive connector 253a/253b shown in FIG. 3 and FIG. 4B. The first ground bump 13 over the substrate 11 is connected to the second ground bump 23 of the flip chip via the structural connection of the first conductive connector 201a/201b in FIG. 2D and the first conductive connector 251a/251b shown in FIG. 3 and FIG. 4B.

Referring to FIG. 4A and FIG. 4B, in other words, the first conductive connector (the connected first conductive connectors 201a/201b and 251a/251b) is located between the substrate and the flip chip, and electrically connected to the first expansion bump 131 of the first ground bump 13 and the second expansion bump 233 of the second ground bump 23. The first conductive connector has a fully enclosed shape, such as but limited to a fully enclosed ring shape. The second conductive connector (the connected second conductive connectors 203a/203b and 253a/253b) is located between the substrate and the flip chip, and structurally in contact with the first terminal 151 of the first signal line 15 and the second terminal 2311 of the second signal line 231. The second conductive connector has a rod shape and serves as a center of axis of the first conductive connector.

Accordingly, the application of the transmission structure to a high-frequency flip chip package may reduce the possibility of underfill from causing a vertical transmission between connected lines. Thus, the transmission structure may enhance the transmission efficiency of a microchip and a package substrate and further reduce both insertion loss (smaller than 0.6 dB) and return loss (smaller than 20 dB).

The vertical transmission structure may be applied, for example but not limited to, the transmission between microstrip line and strip line, microstrip lines, coplanar waveguides, or coplanar waveguide and microstrip line. Moreover, the vertical transmission structure may be applied to the flip chip package, low temperature co-fired ceramics package (LTCC), high temperature co-fired ceramics package (HTCC), organic laminate multichip modules (MCM-L) or deposited thin film MCM (MCM-D).

Although the present invention has been explained in relation to its preferred embodiment, it is to be understood that other modifications and variation can be made without departing the spirit and scope of the invention as hereafter claimed.

What is claimed is:

1. A transmission structure of high-frequency transmission line, comprising:
   a substrate, comprising an insulating surface;
   a pattern of high-frequency transmission structures, formed over the insulating surface, comprising:
     a signal line, having a bar bump and a terminal; and
     a ground bump, set coplanarly with and electrically isolated from the signal line, and comprising an expansion bump surrounding the terminal;
   a dielectric layer, formed over the pattern of high-frequency transmission structures, wherein the dielectric layer exposes the terminal and the expansion bump of the ground bump;
   a first conductive connector, disposed over the dielectric layer and in contact with the exposed expansion bump; and
   a second conductive connector, disposed over the dielectric layer and in contact with the exposed terminal, wherein the second conductive connector serves as a center of axis of the first conductive connector,
   wherein a distance between the expansion bump and the terminal is larger than a distance between the ground bump and the bar bump.

2. The transmission structure of high-frequency transmission line according to claim 1, wherein the first conductive connector comprises a rod shape and the second conductive connector comprises a fully enclosed shape surrounding the first conductive connector.

3. The transmission structure of high-frequency transmission line according to claim 1, wherein the substrate comprises glass, silicon, ceramic or polymer.

4. The transmission structure of high-frequency transmission line according to claim 1, wherein the pattern of high-frequency transmission structures comprises a copper layer or a gold layer.

5. The transmission structure of high-frequency transmission line according to claim 1, wherein the first conductive connector and the second conductive connector comprise a titanium layer or a gold layer.

6. A transmission structure of a chip, comprising:
   a chip, having an insulating surface;
   a signal line, disposed over the insulating surface, wherein the signal line includes a bar bump and two terminals;
   a ground bump, set coplanarly with and electrically isolated from the signal line, and comprising two expansion bumps respectively surrounding the two terminals;
   a dielectric layer, disposed over the signal line and the ground bump, wherein the dielectric layer exposes the two terminals and a portion of each expansion bump;
   two first conductive connectors, disposed over the dielectric layer, wherein the two first conductive connectors respectively correspond and in contact with the two exposed expansion bumps; and
   two second conductive connectors, disposed over the dielectric layer and respectively in contact with the two exposed terminals, wherein each of the second conductive connectors respectively serves as a center of axis of the first conductive connectors.

7. The transmission structure of chip according to claim 6, wherein each of the first conductive connectors comprises a rod shape and each of the second conductive connectors comprises a fully enclosed shape surrounding the corresponding first conductive connector.

8. The transmission structure of chip according to claim 6, wherein the signal line and the ground bump comprise a copper layer or a gold layer.

9. The transmission structure of chip according to claim 6, wherein the two first conductive connectors and the two second conductive connectors each comprises a titanium layer or a gold layer.

10. A high-frequency flip chip package structure, comprising:
    a substrate, comprising a first signal line and a first ground bump coplanarly and separately set and electrically isolated from each other, wherein the first signal line comprises two first bar bumps and two first terminals, and the first ground bump comprises two first expansion bumps each surrounding one of the first terminals;
    a flip chip, comprising a second signal line and a second ground bump coplanarly and separately set and electrically isolated from each other, wherein the second signal line comprises a second bar bump and two second terminals, and the second ground bump comprises two second expansion bumps each surrounding one of the second terminals;

a first conductive connector, located between the substrate and the flip chip, wherein the first conductive connector is electrically connected to the first expansion bump of the first ground bump and the second expansion bump of the second ground bump; and a second conductive connector, located between the substrate and the flip chip, wherein the second conductive connector is connected to the first terminal of the first signal line and the second terminal of the second signal line, and the second conductive connector serves as a center of axis of the first conductive connector.

11. The high-frequency flip chip package structure according to claim 10, wherein the second ground bump and the first signal comprise a copper or gold layer.

12. The high-frequency flip chip package structure according to claim 10, further comprising a dielectric layer covering a portion of the first ground bump and a portion of the first signal line.

13. The high-frequency flip chip package structure according to claim 10, further comprising a dielectric layer covering a portion of the second ground bump and a portion of the second signal line.

14. The high-frequency flip chip package structure according to claims 12 or 13, wherein the dielectric layer comprises a benzocyclobutene, polyimide, nitride, oxide or ceramic layer.

15. The high-frequency flip chip package structure according to claim 10, wherein the substrate further comprises an insulating surface and is made of glass, silicon, ceramic or polymer.

16. The high-frequency flip chip package structure according to claim 10, wherein the first conductive connector comprises a titanium layer or a gold layer.

17. The high-frequency flip chip package structure according to claim 10, wherein the second conductive connector comprises a titanium or gold layer.

18. The high-frequency flip chip package structure according to claim 10, wherein the first ground bump and the first signal line comprise a copper layer or a gold layer.

* * * * *